United States Patent
Bartush et al.

(10) Patent No.: US 6,259,148 B1
(45) Date of Patent: Jul. 10, 2001

(54) MODULAR HIGH FREQUENCY INTEGRATED CIRCUIT STRUCTURE

(75) Inventors: Thomas Adam Bartush, Wappingers, NY (US); David Louis Harame, Essex Junction; John Chester Malinowski, Jericho, both of VT (US); Dawn Tudryn Piciacchio, Fishkill; Christopher Lee Tessler, Campbell Hall, both of NY (US); Richard Paul Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/330,614

(22) Filed: Jun. 11, 1999

Related U.S. Application Data (60) Provisional application No. 60/096,432, filed on Aug. 13, 1998.

(51) Int. Cl.[7] .............................. H01L 23/48; H01L 39/02
(52) U.S. Cl. ........................ 257/531; 257/533; 257/625; 257/691; 257/713
(58) Field of Search ................................ 257/531, 533, 257/625, 713, 691; 438/128, 380, 381, 384, 424, 465, 928

(56) References Cited

U.S. PATENT DOCUMENTS

| | | | |
|---|---|---|---|
| 4,830,706 | 5/1989 | Horwath et al. | 156/643 |
| 4,859,633 * | 8/1989 | Bayraktaroglu | 257/531 |
| 5,151,769 | 9/1992 | Immorlica, Jr. et al. | 357/53 |
| 5,206,712 | 4/1993 | Kornrumpf et al. | 361/393 |
| 5,528,209 * | 6/1996 | Macdonald et al. | 257/691 |

FOREIGN PATENT DOCUMENTS

| | | |
|---|---|---|
| 465199A1 | 8/1992 | (EP) . |
| WO98/15981 * | 4/1998 | (WO) . |

OTHER PUBLICATIONS

Case, Michael et al., High Performance Microwave Elements for SiGe MMICs, 1995 IEEE Cornell Conf. 8 pp.

Cataldo, Anthony et al., IBM Leads Charge to SiGe Production, Electronic Engineering Times, Jan. 26, 1998 pp. 1&2.

Laney, David C. et al., Low Loss Microwave Transmission Lines and Inductors Implemented in a Manufacturable Si/SiGe HBT Process, BCTM meeting in Minnesota, 1998.

* cited by examiner

*Primary Examiner*—Matthew Smith
*Assistant Examiner*—Igwe U. Anya
(74) *Attorney, Agent, or Firm*—Judith D. Olsen

(57) ABSTRACT

Disclosed is a manufacturable silicon-based modular integrated circuit structure having performance characteristics comparable to high frequency GaAs-based integrated circuit structures, comprising materials and made in process steps which are compatible with existing low cost silicon-based integrated circuit processing.

16 Claims, 12 Drawing Sheets

EXPECTED VALUES $$Z_o = \frac{120\pi / \sqrt{\varepsilon_{eff}}}{W/h + 1.393 + 0.667 \ln(W/h + 1.444)}$$

WITH $\varepsilon_{eff} = 2.8$, $h = 13 \mu m$, $Z_{15um} = 68.4 \Omega$ $Z_{27um} = 50.5 \Omega$ $Z_{38.5um} = 40.7 \Omega$

FIG. 8A
Zmax Calculation

$L = \lambda/4$ $Z_{max} = Z_o \tanh\left(\int \dfrac{\pi}{2} + \dfrac{\alpha\lambda}{4}\right)$

FIG. 8B

MODULAR HIGH FREQUENCY INTEGRATED CIRCUIT STRUCTURE

CLAIM OF PRIORITY

Priority is claimed on a Provisional application Ser. No. 60/096,432 deposited in the United States Patent and Trademark Office Aug. 13, 1998 by Express Mail, Label No. EL140120622US.

BACKGROUND OF THE INVENTION

1. Field of the Invention

This invention relates generally to the field of high frequency integrated circuits.

2. Description of the Related Art

High frequency microwave-range integrated circuits (ICs) based on gallium arsenide (GaAs) are known. Lower frequency-range integrated circuits which include components fabricated on silicon (Si) are also known. It would be highly desirable to extend the high frequency performance capacity of GaAs-based ICs to Si-based ICs, using materials and equipment which are adaptations of those whose use is well established in silicon processing.

Silicon technology has been the foundation of the microelectronics industry, but in attempts to extend the more mature silicon technology to the integration of high frequency microwave components such as coplanar transmission lines and inductors, the inherent limitation of the resistivity of silicon, which is maximal in pure silicon, has been a barrier to fabricating Si-based devices which are technically noncompetitive with GaAs in the microwave range. For example, loss at about 10 GHz on silicon is approximately 20 times that on GaAs; GaAs-based microwave structures have the low loss tangent that would be desirable to achieve in manufacturable Si-based structures. Manufacturability requires processes and results that are stable, predictable, reproducible and cost effective. High frequency devices based on GaAs are relatively more expensive to fabricate than are lower frequency devices based on Si, but lower frequency devices based on Si can be fabricated by processes that produce stable, predictable and reproducible results.

U.S. Pat. No. 5,528,209 issued Jun. 18, 1996 to Mcdonald et al. describes a silicon-based high frequency monolithic structure in which the high frequency transmission lines are fabricated by electroplating gold. Gold plating may give rise to problems such as cost, added process steps to create barriers to electromigration of gold into copper and handling and disposal of the gold electroplating baths and rinses. The present invention does not include gold processing. Rather, wet electroprocessing is avoided by using sputter deposition and sputter cleaning and ashing. The '209 patent describes via fabrication by reactive ion etching (RIE). In the present invention, via (through-hole) photolithography, including wet or reactive ion etching (RIE) is avoided in fabricating internal vias by using laser ablation, a process which provides superior control of the critical via dimension of slope angle. The '209 patent uses benzocyclobutene (BCB) resin, which was found not to laser well for the purposes of the present invention. The polyimide (PI) used in the present invention has the advantages of lasering well, low dielectric constant, low moisture absorbency, ability to be applied and cured in a layer up to at least 15 microns thick, and ability to withstand the temperature required to solder or wire bond the completed device without cracking. A paper presented at the 1995 IEEE conference, "High Performance Microwave Elements for SiGe MMICs" by Michael Case et al. describes a Si-based microwave device using BCB, a resinous composition used in the prepreg art, as the dielectric material. BCB was found to be unsuitable for the processing of the present invention, particularly with respect to laser processing.

An article by Anthony Cataldo and Ron Wilson beginning on page 1 in the Electronic Engineering Times dated Jan. 26, 1988 describes some of the IBM activity in the area of SiGe-based RF ICs.

"Low-Loss Microwave Transmission Lines and Inductors Implemented in a Manufacturable Si/SiGe HBT Process" by David C. Laney, Lawrence E. Larson, John Malinowski, David Harame, Seshu Subanna, Rich Volant, Michael Case and Paul Chan was orally presented in September, 1998 at the BCTM meeting in Minnesota. In it are described experimental results of measurements made for square planar inductors and microstrip transmission lines for standard Si VLSI structures having CuAl metallization and thick polyimide dielectric. The work indicates the manufacturability in Si VLSI technology of these lines and inductors and predicts their use in high performance, low cost Si-based 5–10 GHz MMICs in the future.

U.S. Pat. No. 4,830,706 issued May 16, 1989 to Ronald S. Horwath et al. describes one method, not involving laser, in which slope-walled vias with rounded corners are fabricated by finally curing a resinous insulating material in which, after a preliminary partial cure, the via walls had been conventionally straight and corners square. The patent describes problems associated with straight-walled vias and benefits of slope-walled vias and rounding at the intersection of via wall and planar surface.

None of the references anticipates the process and article of manufacture of the present invention.

SUMMARY OF THE INVENTION

Accordingly, it is an object of the invention to provide a silicon-based integrated circuit structure having the high frequency performance characteristic of GaAs-based structures.

It is a further object of the invention to provide a high frequency silicon-based integrated circuit structure having the performance characteristics of high frequency GaAs-based structures, in which the processing steps and equipment employed are compatible with the processing steps and equipment employed in existing silicon technology processing, and for which the overall cost of manufacture is market competitive.

These and other objects are accomplished in the present invention, wherein a silicon-based high frequency integrated circuit structure includes a dielectric resin separating the signal lines. The substrate is typical of that used in Si-based back-end-of-line (BEOL) IC fabrication, metal deposition in the fabrication of elements such as inductors, transmission lines and capacitors is efficiently performed by vacuum deposition of non-precious metals, and via fabrication is performed by laser ablation rather than by wet processing or RIE in thick polyimide dielectric of a type used also in non-microwave applications Use of the laser enables the fabrication of predictably and reproducibly smooth and even slope-walled vias on which continuous metallization can be deposited despite the thickness of the dielectric.

The number of processing steps in the present invention is reduced compared to the art, and the number of wet processing steps is minimized. The resulting silicon-based modular structure can incorporate numerous integrated high quality passive microwave lines and components and a ground plane fabricated in BEOL metallurgy. Structures can be built with or without a ground plane, depending upon the application. It is high frequency performance competitive with GaAs-based structures and is cost competitive with silicon-based structures. It is useful in applications and markets such as, for example, tuned matching networks, reactive loading, power splitters, transistors, inductors, transmission lines, resonators, couplers, analog, mixed signal, RF, communications, impedance transformers, monolithic microwave integrated circuit (MMIC) interconnects and like microwave elements.

Advantages include the provision in transmission line structures of low loss compared to BEOL Si-based structures; self-resonant frequency beyond GaAs while showing significant Q factor improvement compared to BEOL; Si enabling process for RADAR (20 GHz) applications which otherwise cannot have integrated passive elements; and provision of high level of integration (BiCMOS) for GaAs. The modularity of the structure of the present invention permits the addition of high frequency microwave receive/transmit capability to be mounted to existing products on Si, SiGe, GaAs and other semiconductor substrates.

In one embodiment of the present invention, a SiGe wafer is processed normally through solid conductive terminal via formation. Polyimide (PI) 5811, a product of E.I.Dupont et Nemours and Co. of Delaware, in an amount sufficient to result in a cured layer of nominally 15 microns, is spun on and cured on the wafer at about 400 degrees C. Laser ablation is performed on the cured PI down to each terminal stud via to create a rounded slope-walled via of about 62 degrees. Between the SiGe and the polyimide is TV dielectric, which comprises a silicon oxide/nitride sandwich layer. Ashing the ablated via in an oxygen-containing plasma by RIE, optionally followed by sputter etching, assures the removal from the slope-walled via of any debris left behind by the laser. A via at its narrowest width is about 10 microns in diameter. Next a top metallization layer about 2 microns to about 2.5 microns thick of AlCu is sputter deposited over the PI, including along the sloped walls and the bottom of the terminal stud via, for electrical communication between transmission lines. The AlCu metallurgy can be about 0.2% to about 5.0% by weight of Cu. After photolithography a top metal etch shapes the transmission lines. A second layer of resist is spun onto the structure and cured to a thickness of about 3 microns and "ball vias" are fabricated to provide electrical communication with the transmission lines at predetermined locations. Whereas the layer of thick polyimide need not be photoactive because the topography is shaped by laser rather than by photolithography, the second layer of polyimide can be photoactive since it is thin enough to be patterned photolithographically rather than by laser. PbSn solder is applied at the ball via, reflowed and cooled to form a ball of solder for subsequent controlled collapse chip connection (C4) to a customer-defined package. Wire bonding is an alternate to C4 bonding.

In order to facilitate further understanding of the present invention, reference is made to the A following detailed description taken in conjunction with the drawings:

DESCRIPTION OF THE PREFERRED EMBODIMENTS

Fabrication and Structure

Figure 1A:
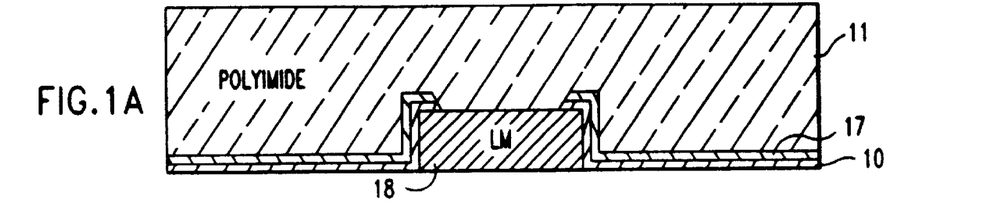
FIGS. 1A, 1B, 1C, 1D and 1E together comprise a series drawings illustrating, in cross section, major stages in the preparation of the structure of the present invention.

FIG. 1A shows a SiGe wafer substrate (10) on which a ground plane (17) has been prepared, including terminal stud (18). A thick layer of dielectric material (11), preferably either polyimide 5811 or 5878, both products of E.I. Dupont et Nemours and Co. of Delaware is disposed on the surface of wafer substrate (10) which includes terminal stud (18). The dielectric has been applied and cured, i.e. has been heated at about 400 degrees C. in order to evaporate solvent and thermally cross link the resinous PI dielectric. The final thickness of the cured thick polyimide dielectric (11), is about 12 microns to about 15 microns depending on the functional requirement of the ultimate device, is nearly an order of magnitude greater than that conventionally used in silicon-based IC technology. In such a thick layer of PI, wet photolithographic development of precision vias of such narrow width would be impractical or impossible to manufacture. The thick dielectric layer (11) is necessary to prevent signal loss between the microwave transmission lines formed in metallization layer (20) shown in FIG. 1C and the wafer substrate (10) and to assure high quality (Q) inductors at high RF frequencies.

Preferably, the liquid resinous PI dielectric is spun on in one layer and cured to achieve the desired thickness; the slower the spin speed the thicker the layer. Alternatively, the dielectric can be built up to the desired thickness by more than one coat with intermediate curing steps. If the alternative technique is used, the additional step of oxygen ashing followed by applying an adhesion promoter, such as hexamethyl disulfoxide (HMDS) or A1100, an organofunctional silane primer which is a product of Union Carbide, is performed after each cure and prior to the next resin layer application. A Drytek Quad RIE tool from Lam Research of CA was used for ashing, using the following parameters: 200 W power, 50 sccm flow, and 300 mT pressure for a time of 30 seconds/wafer. In the curing process, the temperature is ramped up at about 5 degrees C./minute in a nitrogen atmosphere in an IR oven to a final cure temperature of up to about 400 degrees C. In a 2-step cure process, the first coat is cured up to about 220 degrees C. and the second coat up to about 385 degrees C.

Figure 1B:
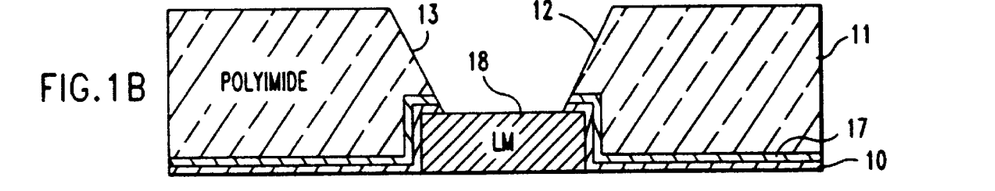
Figure 1C:
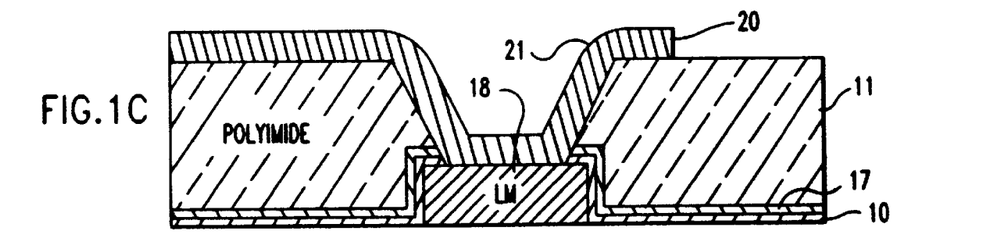

In FIG. 1B is shown a cured PI dielectric layer (11) that has been laser ablated, oxygen-ashed and sputter cleaned, creating a clean via opening (12) which extends to terminal stud (18) and which, due to the laser ablation, has walls (13) which are sloped, preferably about 62 degrees, to receive a continuous metallization layer (20), shown in FIG. 1C. Each via opening (12) includes rounded edges (21), also shown in FIG. 1C, where the wall of the slope-walled stud via (12) intersects with the planar surface of the cured thick PI (11). Laser ablation through this thickness of PI produces precision vias which can be a narrow as about 10 microns to about 25 microns at the narrowest width. Although the laser ablated walls (13) of the vias are preferably angled at about 62 degrees, it should be noted that ablated walls which are angled plus or minus about 15% of 62 degrees between about 52 degrees and about 71 degrees also enable, to a somewhat lesser extent, the fabrication of narrow width precision vias having continuous metallization and rounded edges (21).

The laser removes sufficient PI to form slope-walled via (12) without damaging the underlying metal of the terminal stud (18). The laser ablation tool used is a Tamarack model 290, manufactured by Tamarack Scientific Co. of Anaheim, Calif. An excimer laser, medium of xenon chloride, is generated at a wavelength of 308 nm, 300 Hz, 400 pulses/mm2 and 200 mJ/cm2. Any remaining debris from the ablation can be removed by oxygen ashing, a 400 pulse/mm2 process which removes less dielectric from the exposed surface of the cured PI dielectric layer (11) which surrounds slope-walled via (12) and results in minimal undercut and substantially uniform thickness of the PI (11). In a Drytek Quad RIE tool, a product of Lam Research of California, ashing is performed at a power of 200 Watts, a flow rate of 50 sccm and a pressure of 300 mT. A sputter preclean just prior to sputtering the continuous metallization layer (20) removes any further residue within the slope-walled via (12).

A blanket sputter deposition of AlCu is then performed to produce the desired thickness for the metallization layer (20), normally about 1 to about 5 microns, such as about 2.5 microns. The metallization layer (20) is then ready to be defined by photolithography and etched into high frequency transmission lines or fabricated into other microwave elements. A solution by volume of 1 part nitric acid: 3 parts deionized water: 16 parts phosphoric acid, the acids being in "off the shelf" concentrations, plus a few drops per gallon of a nonionic surfactant, such as Igepal from Ashland Chemical, is used to etch the AlCu lines. The etchant gives adequate control over fine line width and spacing between lines, which affect loss and impedance, respectively, in the high frequency structure. Improved resolution over wet etch was demonstrated for 4% AlCu and for 0.5% AlCu using a chlorine-based dry RIE. A sputter deposition of antireflective TiN (not shown) on the exposed surface of the metallization layer (20) helps to effect a uniform lithographic process. About 320 Angstroms to about 600 Angstroms of TiN is sufficient. Any residue remaining after the formation of the transmission lines is removed with hot hydrogen peroxide.

Figure 1D:
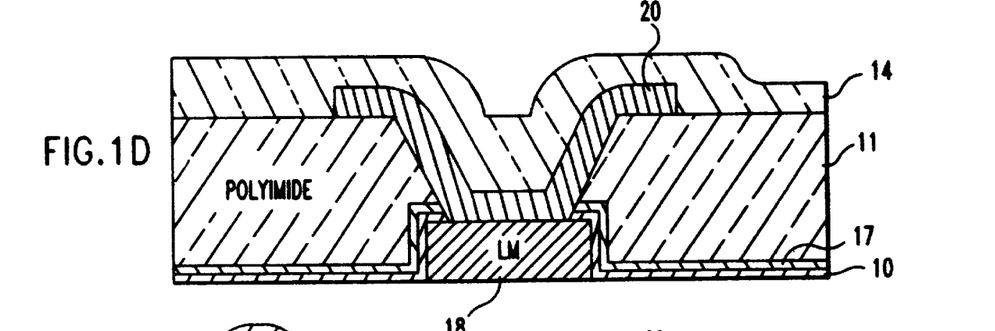
Figure 1E:
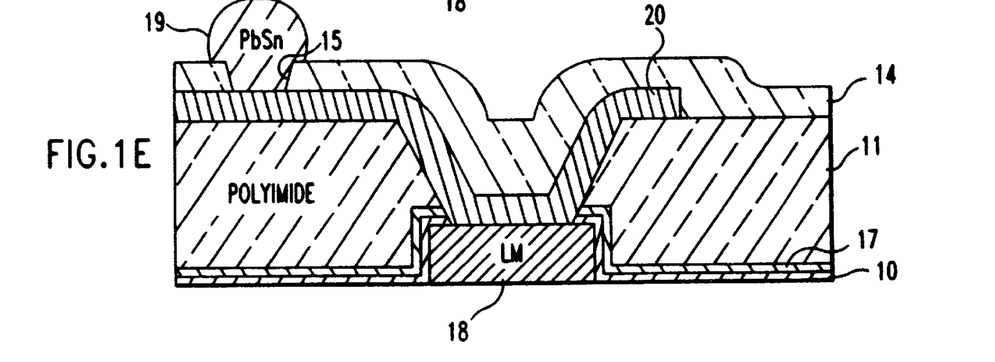

At this point a second dielectric layer of polyimide 5811, shown as (14) in FIG. 1D, is applied to the surface and cured at about 400 degrees C. to result in a thickness of about 3 to about 4 microns, and ball via (15), shown in FIG. 1E, is exposed and developed therein down to the transmission line fabricated in metallization layer (20). In this step laser processing could be used as an alternative to wet photolithography. PbSn solder is applied to ball via (15), where it is reflowed and cooled into a ball shape (19). Wire bonding is an alternate procedure to C4 bonding. The structure is now ready for mounting by means of controlled collapse chip connection (C4) at solder ball (19) onto a customer-defined package.

Figure 2:
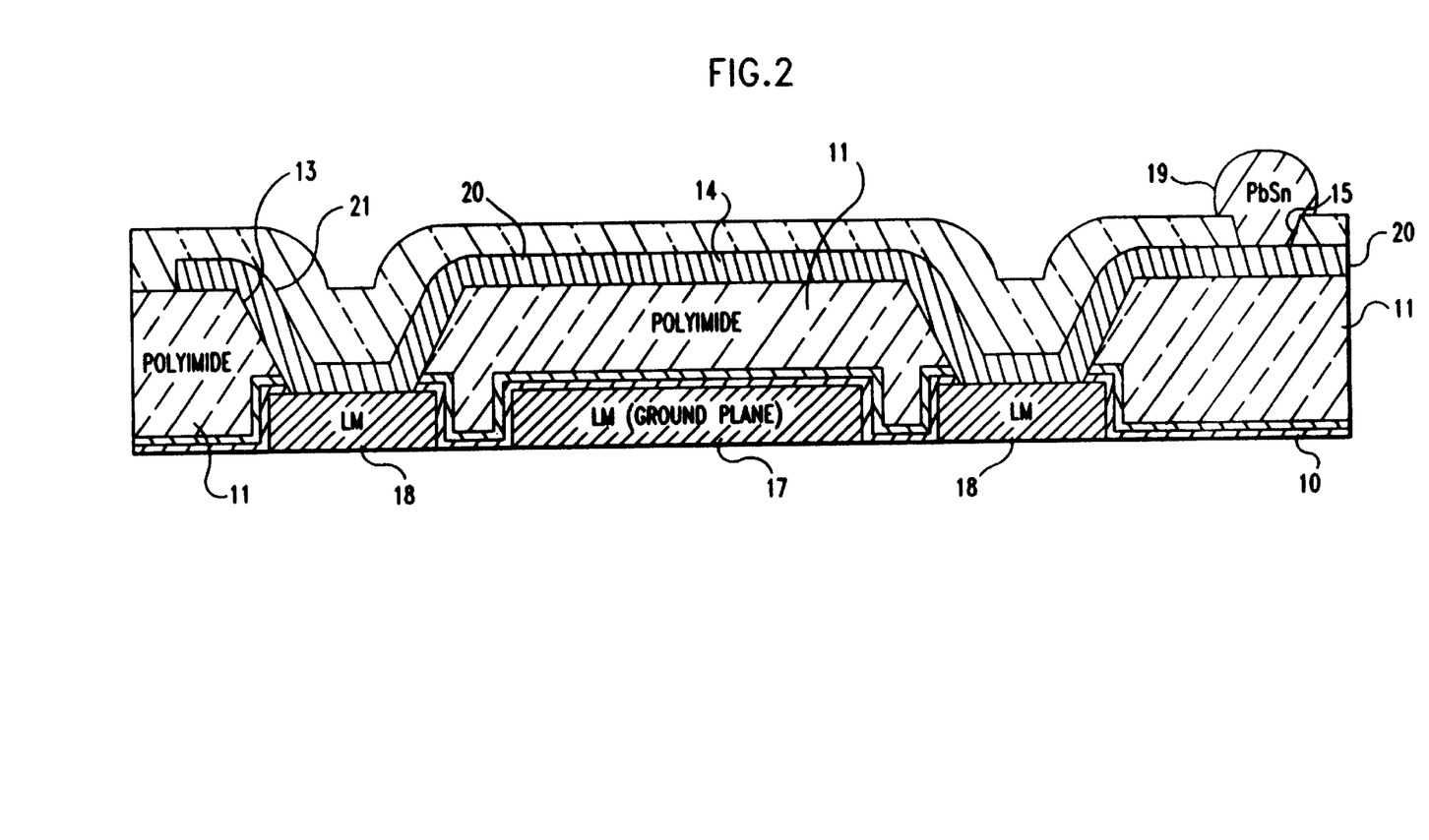
FIG. 2 is a cross-sectional view of a completed structure of the present invention including multiple terminal stud vias and ball vias.

The FIG. 2 cross-section representation of a structure of the present invention indicates that normally there will be a more complex pattern fabricated on a substrate than shown and discussed for FIGS. 1A–1E above for merely one example of each feature.

Measurements

Various measurements were made in order to determine performance characteristics of transmission lines of various lengths and widths disposed over a thick layer of polyimide. Unless otherwise indicated, all measurements were performed on a signal conductor comprised of 2.5 micron thick 4%Cu CuAl disposed over a cured layer of polyimide 5811 having a nominal thickness of about 13 microns and an effective dielectric constant (Eeff) equal to 2.8, which was in turn disposed over a Si substrate coated with a ground plane of about 1.5 microns of about AlCu 4%. Measurements were conducted on 370 micron and on 3362 micron lengths of signal conductor, each having widths of 15 microns and of 27 microns, and on lengths of 171 microns and 1668 microns, each having a width of 8.5 microns.

Two-port S-parameter data were collected and the results compared to the expected values. MatLab, a software program which is a product of MatLab of Massachusetts, was used to calculate the transmission line data for Zo, Eeff and dB (loss) from the measured S-parameter data, not including contributions from contact pads and probes. The data was transferred to a personal computer by means of a general purpose interface board (GPIB). HP Tester 8570, a product of Hewlett-Packard of Oregon, as well as Cascade 100 micron pitch probes, SOLT calibration and Alessi wafer station were used to collect data. The data analysis procedure comprised a method suggested by Professor H. J. Orchard of the University of California at Los Angeles (UCLA), and set forth in FIGS. 13A–13D.

Figure 3A:
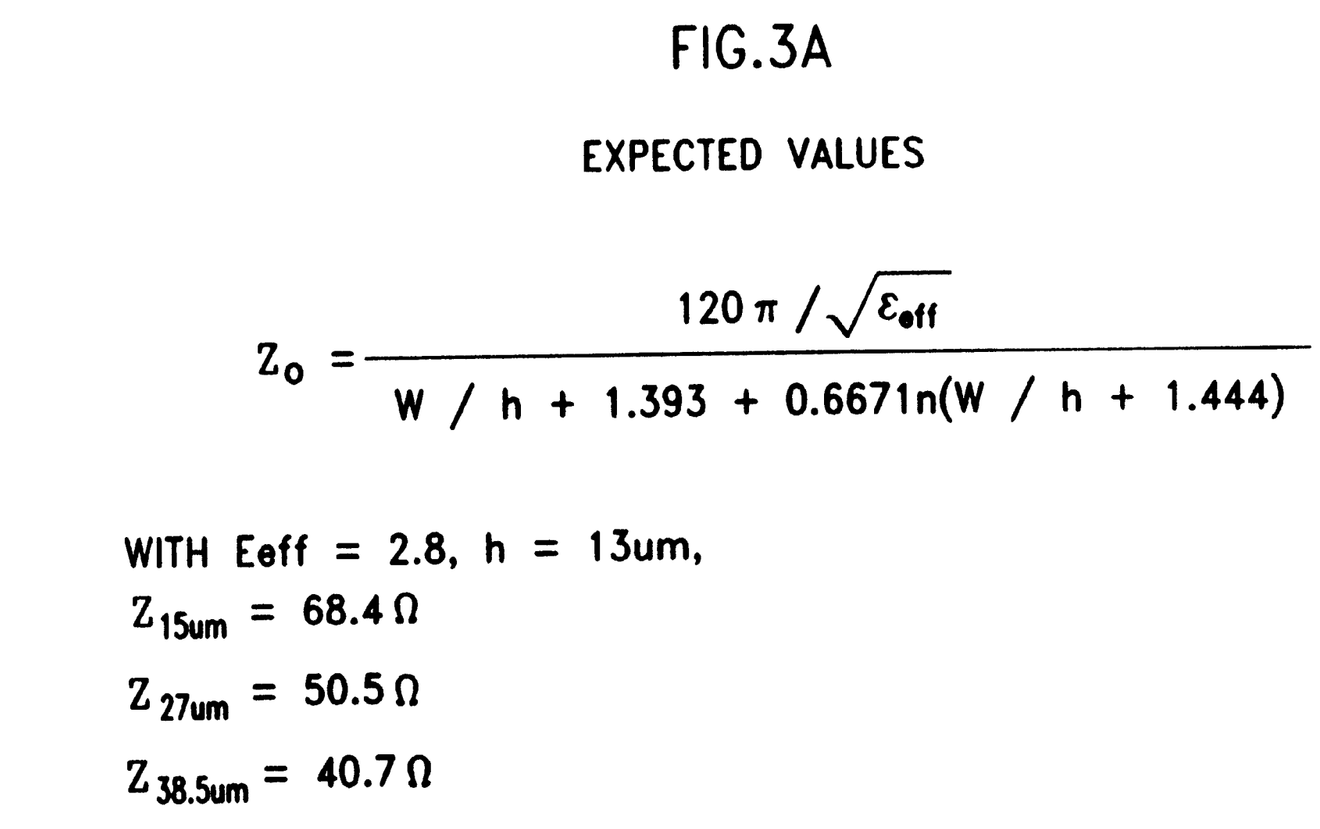
FIG. 3A is the equation used to calculate the predicted values of impedance for transmission lines of each of three widths when the dielectric material on which the lines are disposed is 13 microns thick and has an effective dielectric constant of 2.8. The result of this calculation is shown in FIG. 3B along with the average measured impedance for each width.
Figure 3B:
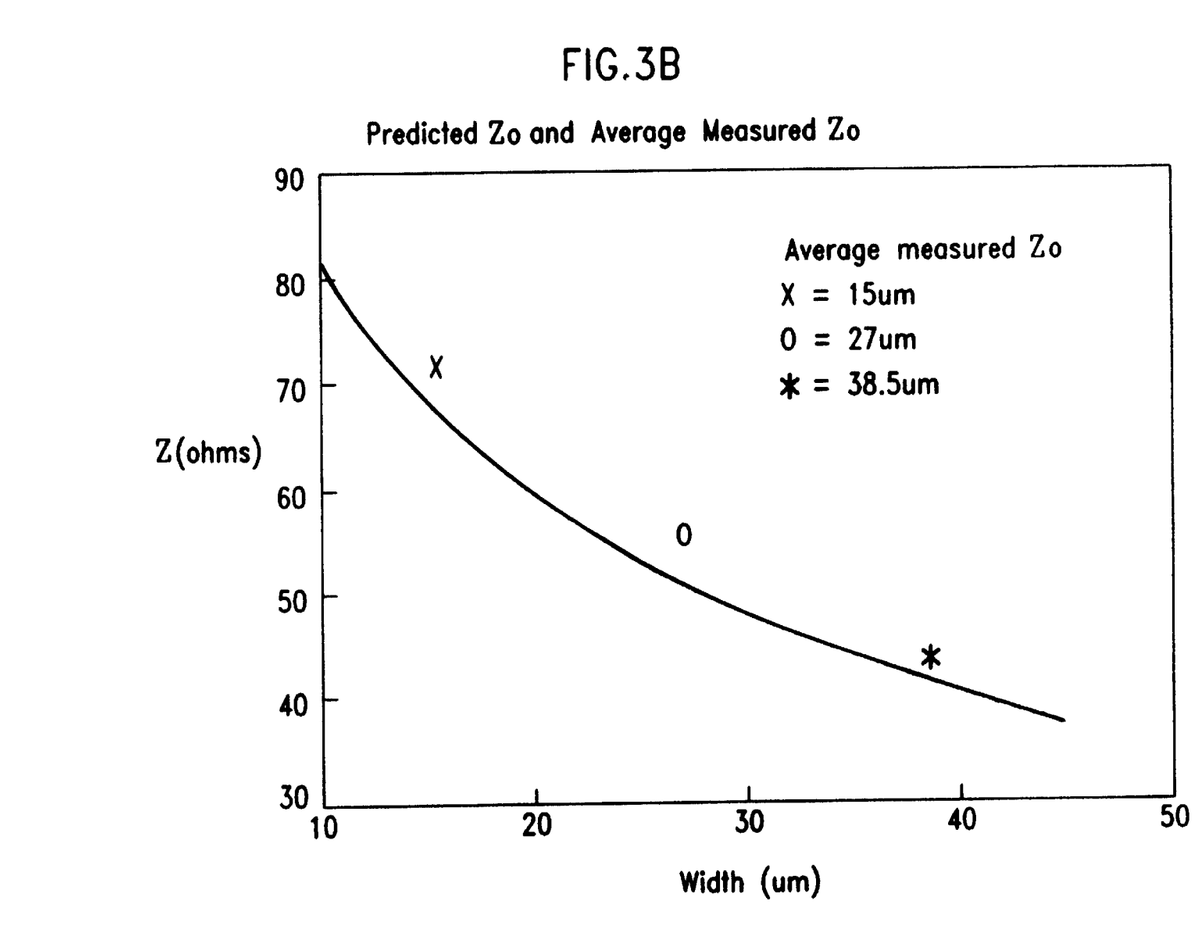

The expected values for impedance (Zo) were calculated using the equation set forth in FIG. 3A and are plotted as a function of line width in FIG. 3B. The three points located slightly above the plot of expected values are measured values. The measured values are within about 10% of the expected values. High impedance is favored by narrower lines.

Figure 4:
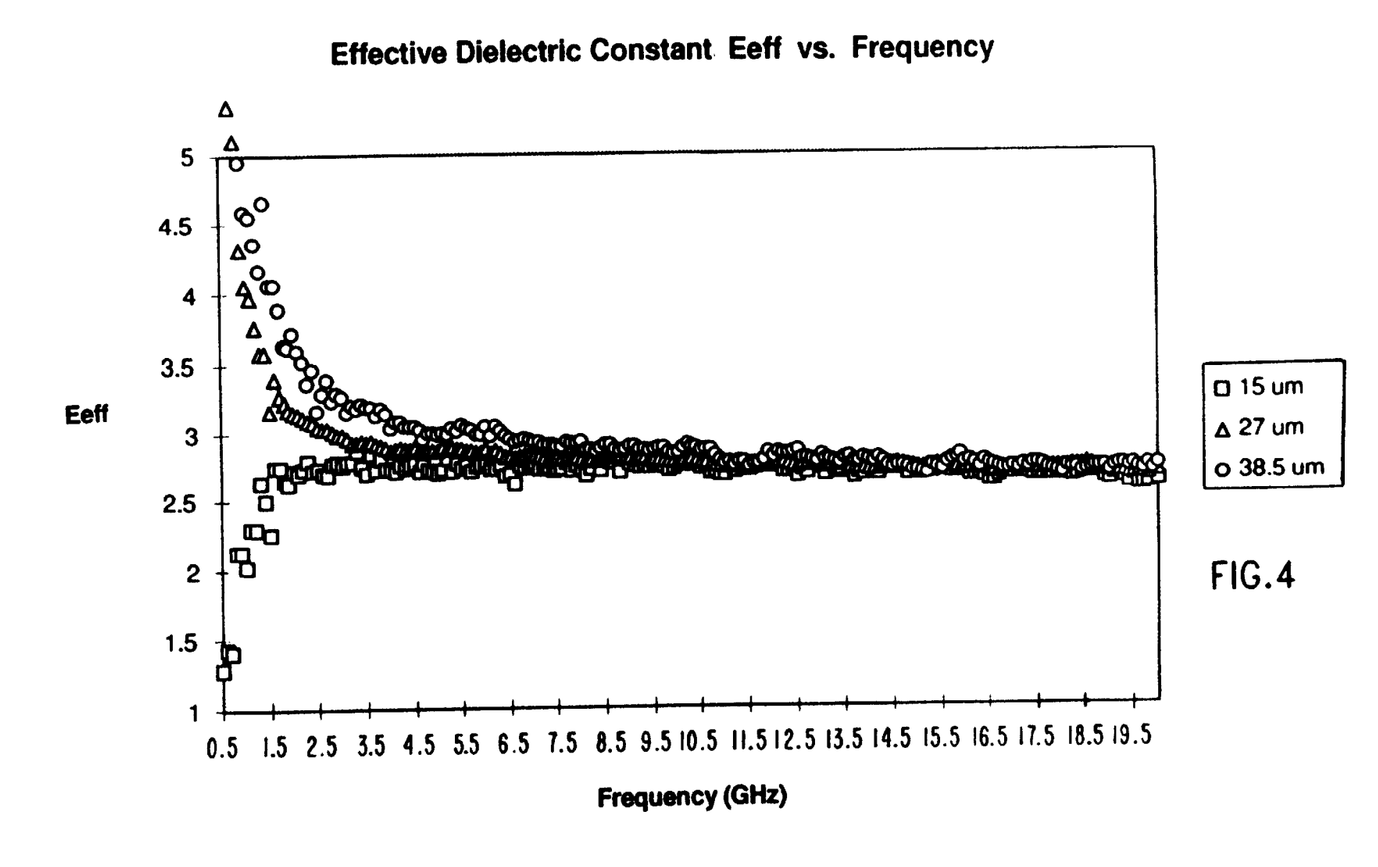
FIG. 4 shows the variation in effective dielectric constant as a function of frequency for each of the three measured line widths.

The variation of Eeff as a function of frequency is shown in FIG. 4 for each measured line width. The values of Eeff are rather consistent for all tested line widths at frequencies greater than about 8.5 GHz.

Figure 5:
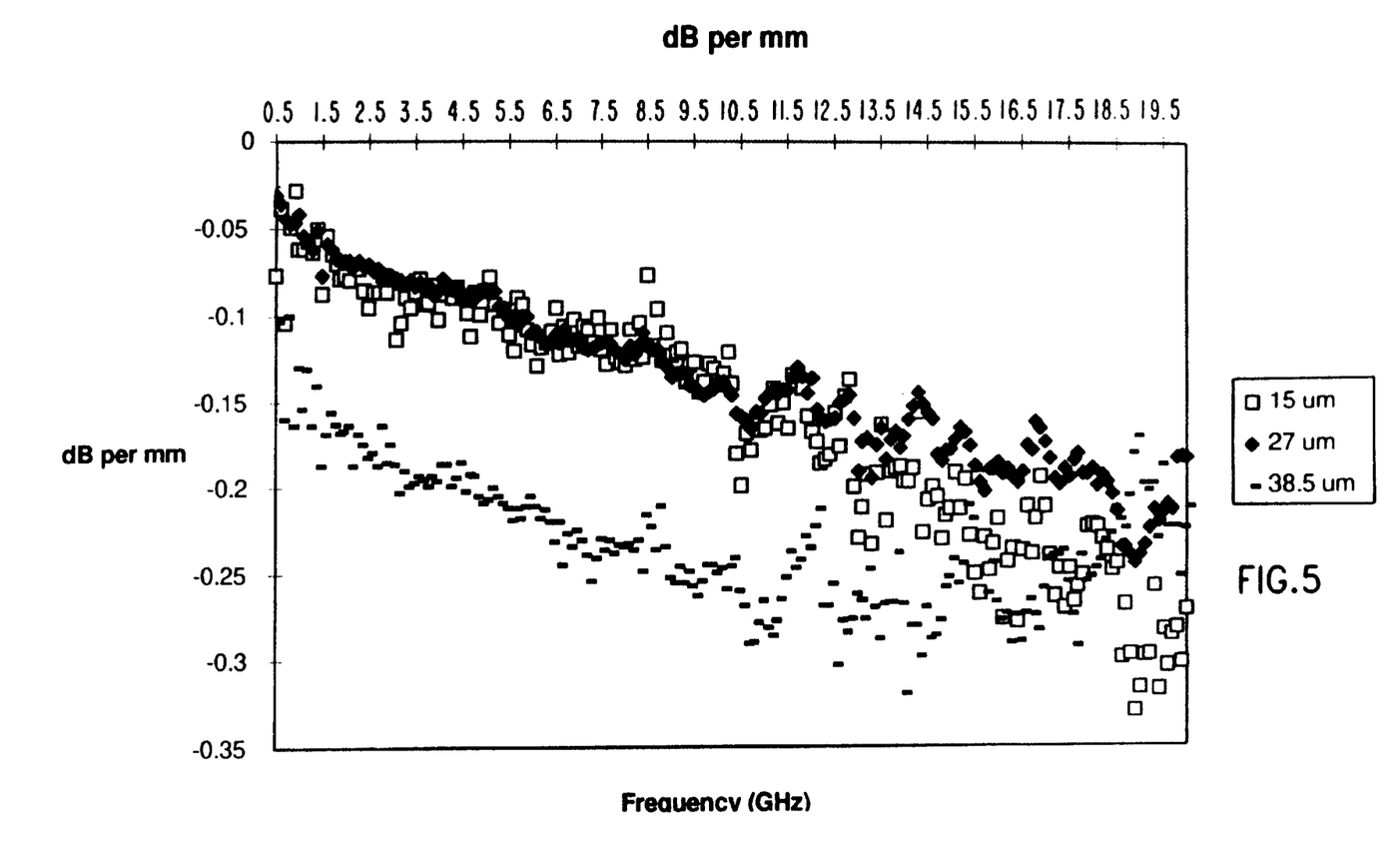
FIG. 5 shows the variation in loss in dB per mm as a function of frequency for each of the three measured line widths.
Figure 6:
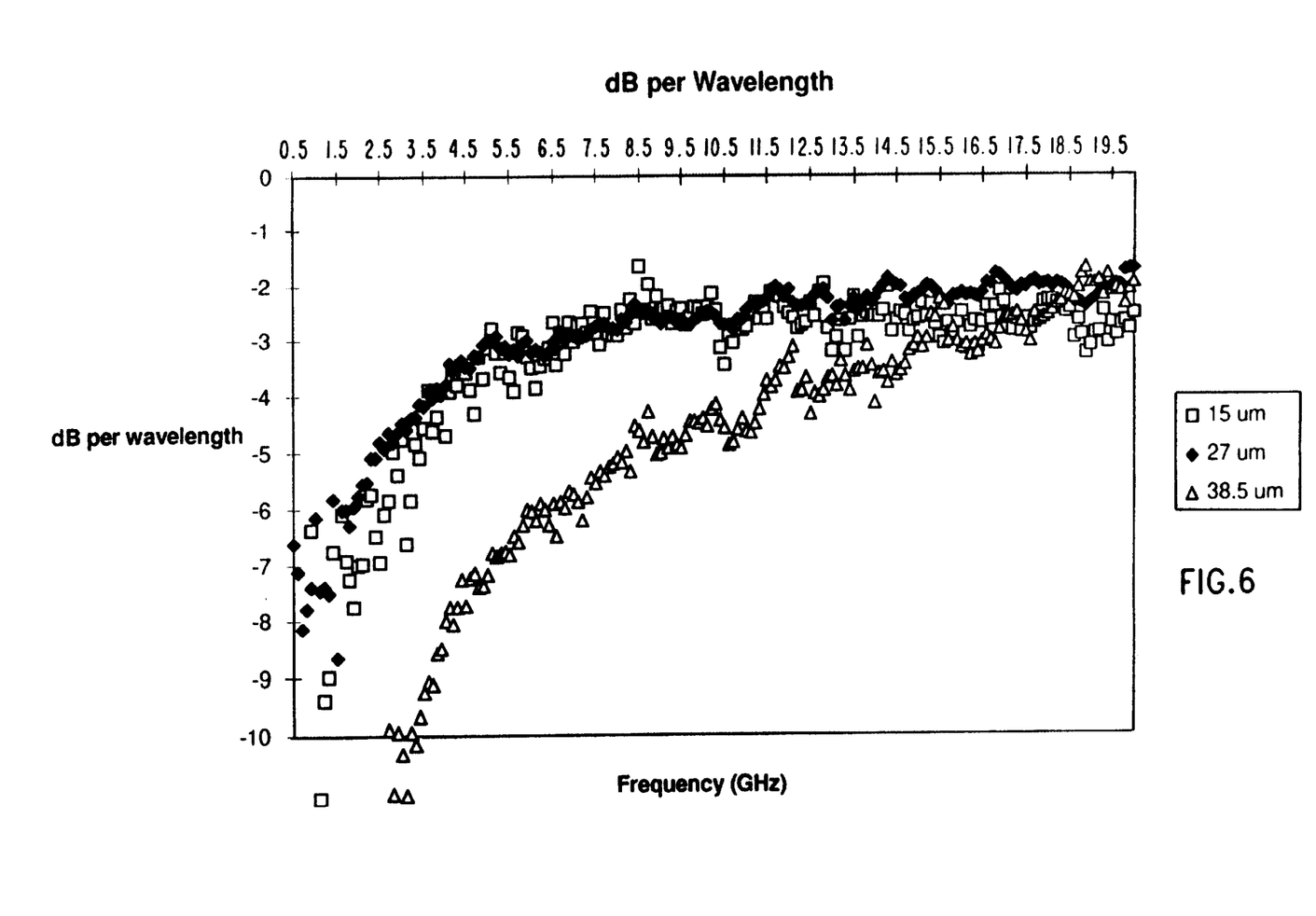
FIG. 6 shows the variation in loss in dB per wavelength as a function of frequency for each of the three measured line widths.

The variation of loss (dB) per mm as a function of frequency for each measured line width is shown in FIG. 5, and for dB per wavelength as a function of frequency is shown in FIG. 6. Loss is generally lower with wider lines at microwave frequencies, but the difference becomes less significant for a given line width at the highest range. The narrower lines show greater consistency in dB across the range of frequencies tested.

Figure 7:
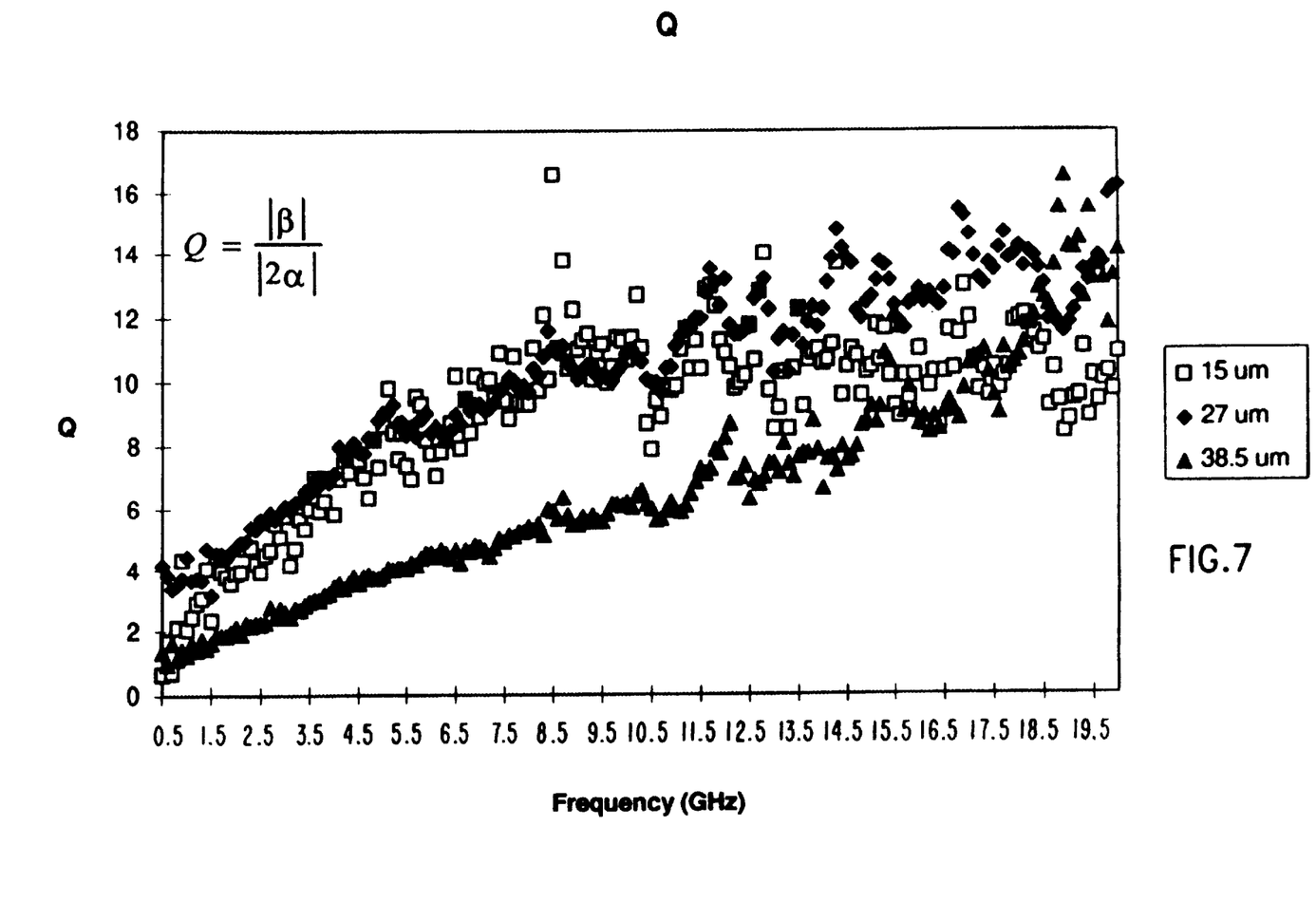
FIG. 7 shows the variation in Q (quality) factor as a function of frequency for each of the three measured line widths.

The variation in Q value as a function of frequency for each measured line width is shown in FIG. 7. Higher Q is favored by the smaller line widths under about 10 GHz, but for all measured frequencies above that value the consistency of Q breaks down for all line widths.

Figure 8A:
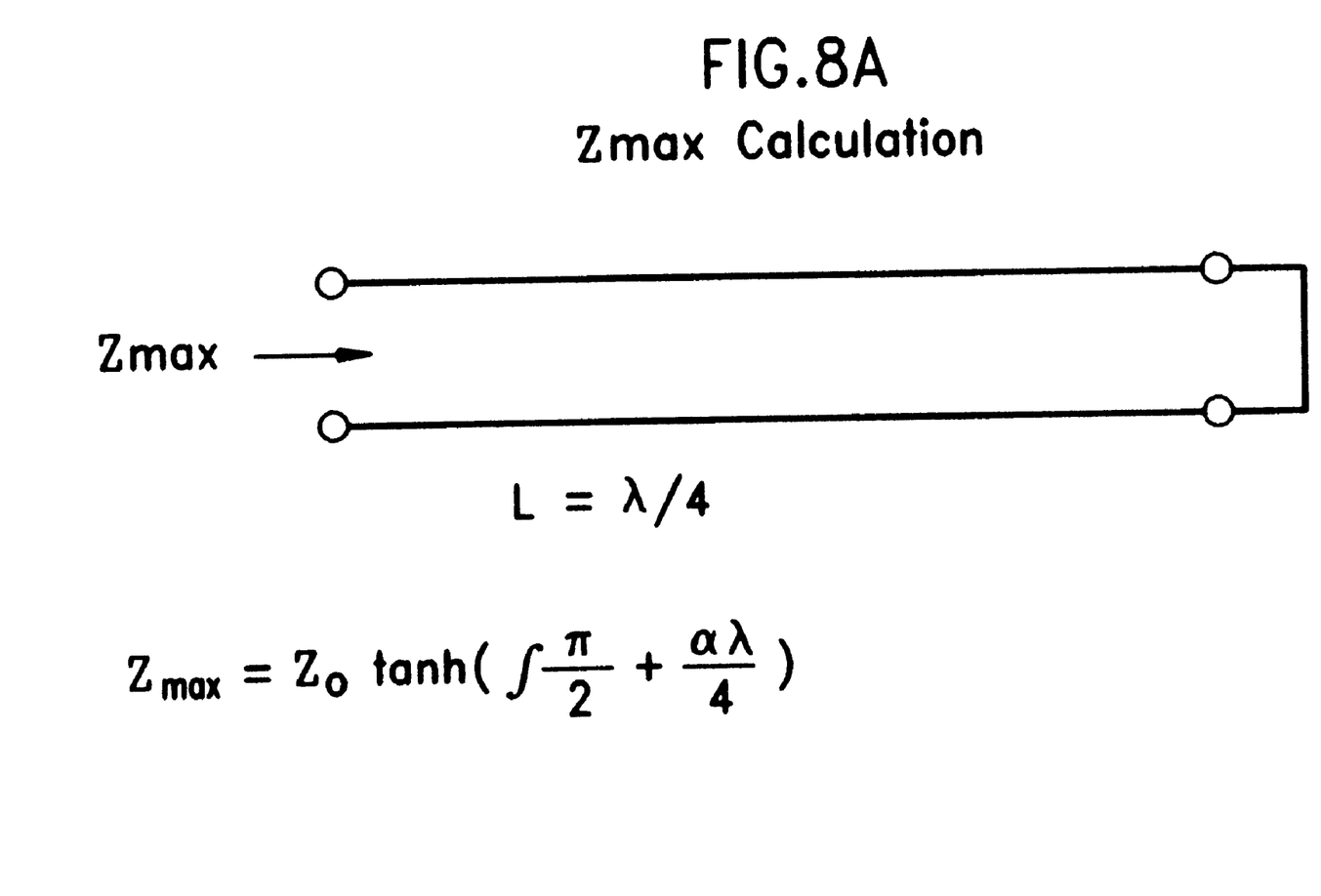
FIG. 8A is the equation used to calculate maximum impedance shown in FIG. 8B as a function of frequency for each of the three measured line widths.
Figure 8B:
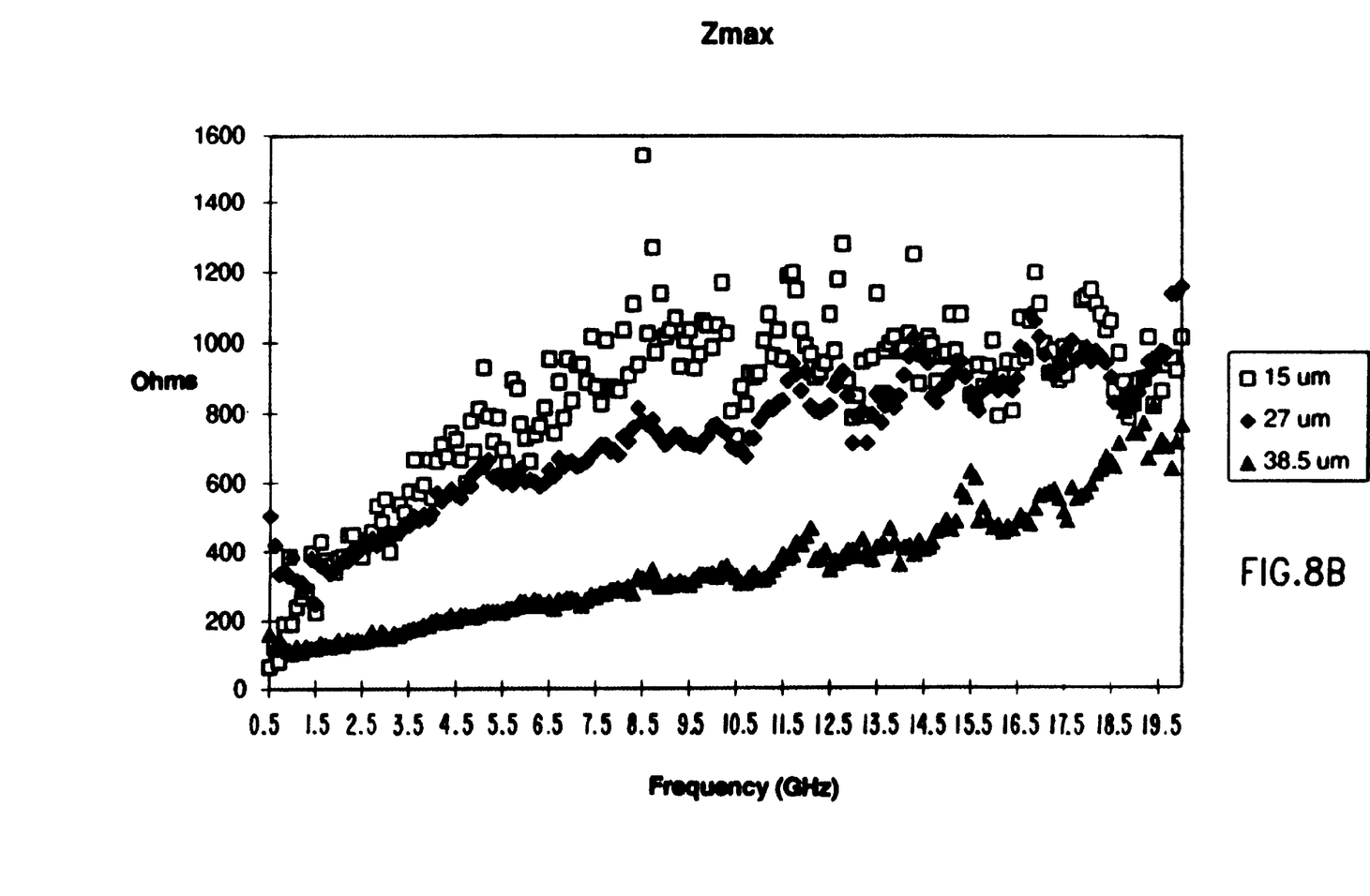
Figure 9:
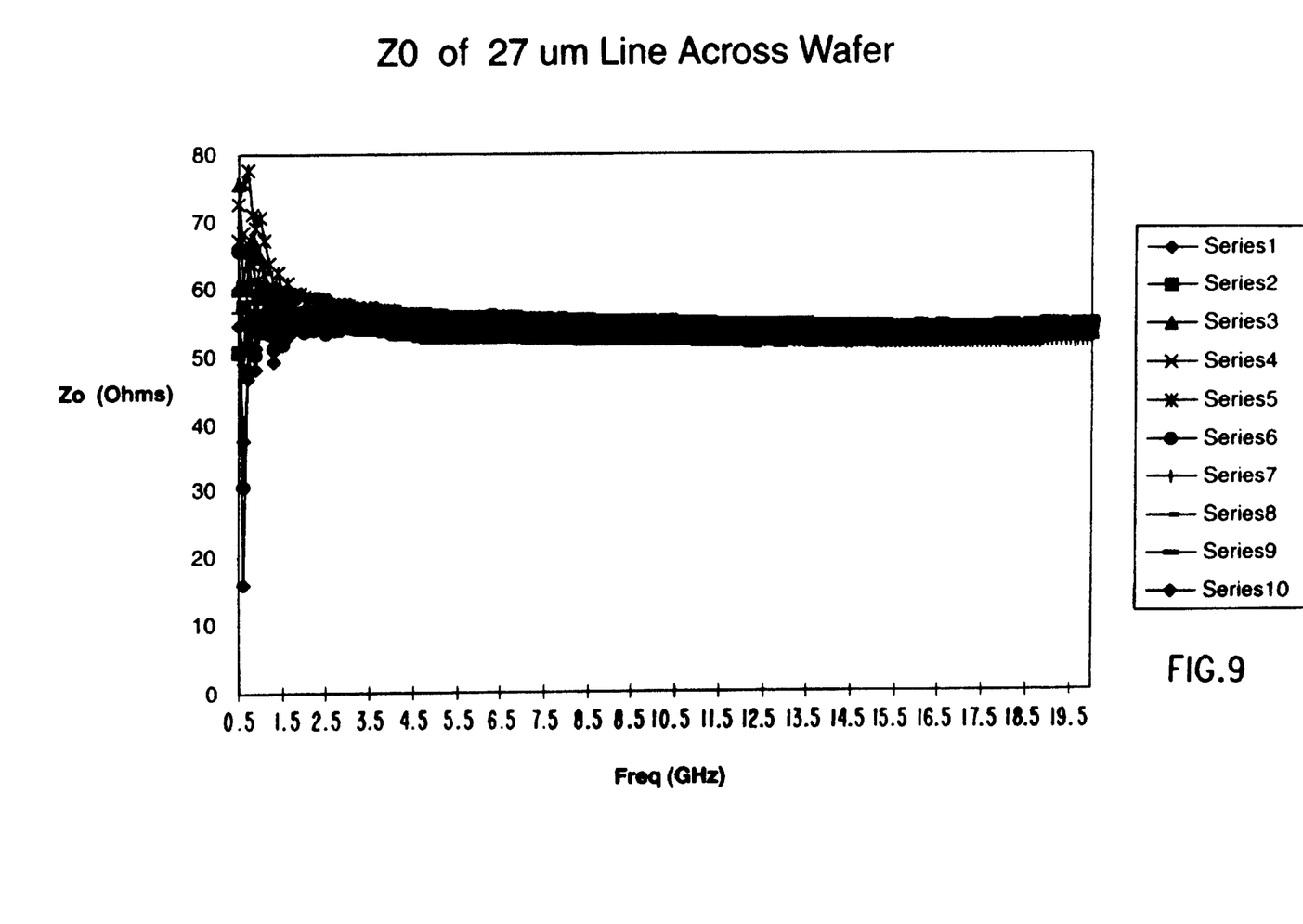
FIG. 9 shows the impedance of a line width of 27 microns as a function of frequency.
Figure 10:
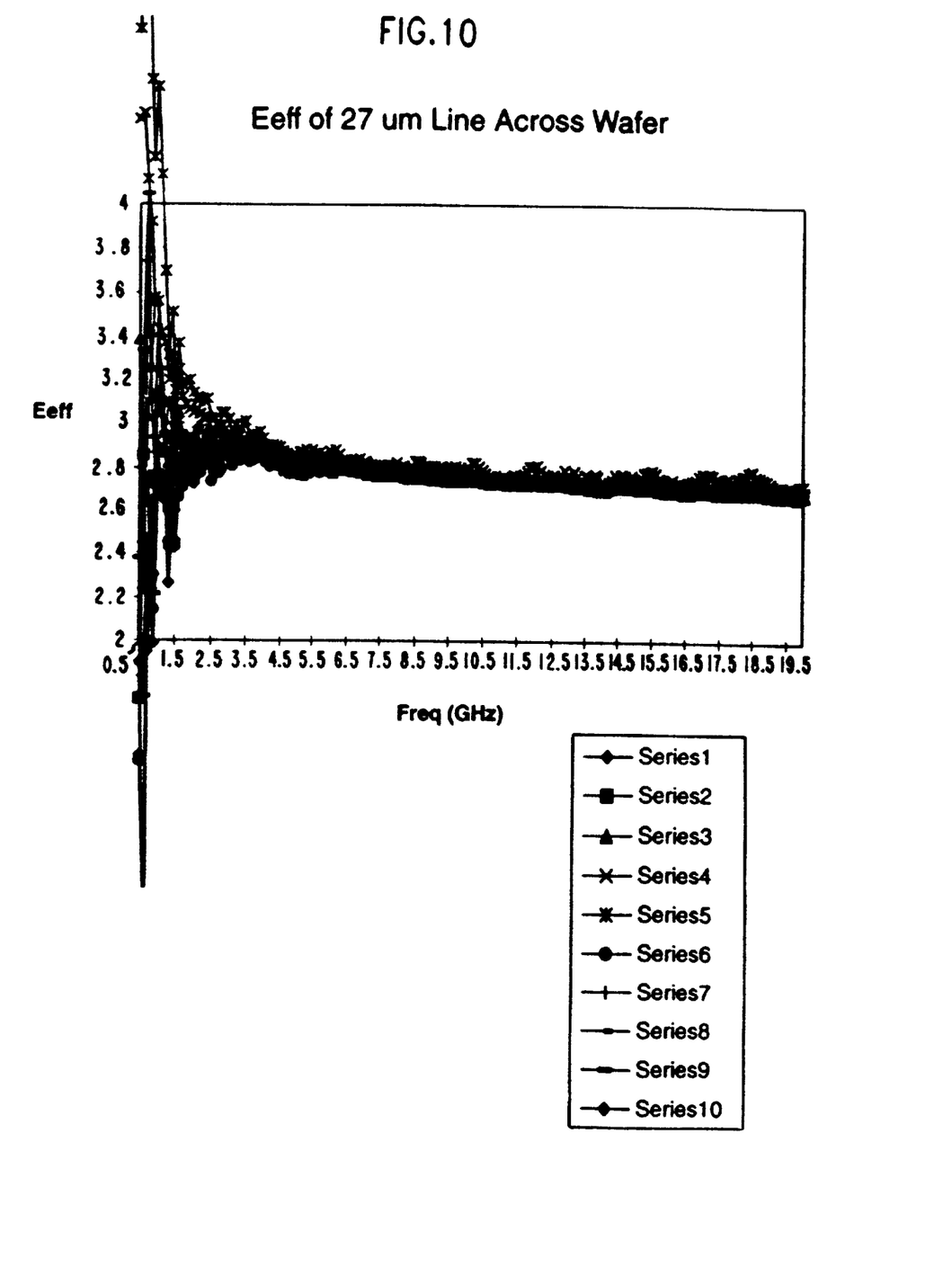
FIG. 10 shows the variation in effective dielectric constant of a line width of 27 microns as a function of frequency.

The Zmax (maximum impedance) as a function of frequency for each measured line width, as calculated by the equation set forth in FIG. 8A, is shown in FIG. 8B. The 15 micron and 27 micron width lines have higher Zmax than the 38.5 micron, but the Zmax values for the 27 micron width line are more consistent than the 15 micron width line at all measured frequencies. The values for the impedance Zo as a function of frequency for a line width of 27 microns are constant at frequencies above about 5.5 GHz , as shown in FIG. 9. The values for the Eeff as a function of a line width of 27 microns are constant at frequencies above about 7.5 GHz, as shown in FIG. 10.

Thick dielectric, while providing lower loss, requires wider signal line width in order to maintain impedance.

The dimensions of the structure of the present invention are a compromise driven by the electrical properties required at the operating frequency of the final product. For example, if the final product is intended for operation at 10 GHz, the dielectric material being 13 microns thick with an Eeff of 2.8, a line width of 30 microns would be a reasonable compromise. Measurement results indicate that the modular structure of the present invention is suitable and manufacturable, i.e. stable, predictable and reproducible, for use in its intended purpose.

Although the invention has been described in conjunction with one or more specific embodiments, modifications will be apparent to those skilled in the art in light of the foregoing information. Accordingly, it is intended that the present invention embrace all such modifications as are encompassed by the spirit and broad scope herein.

What is claimed is:

1. A modular monolithic microwave integrated circuit structure, comprising:
   a. a silicon-based semiconductor substrate on which is disposed a first metallization layer which is patterned to include at least one terminal stud;
   b. a first, thick layer of layer ablatable dielectric material disposed onto the first metallization layer including the at least one terminal stud;
   c. a laser-ablated slope-walled via extending directly through the first thick layer of dielectric material to each of the at least one terminal stud to form at least one slope-walled terminal stud via;
   d. a second patterned metallization layer disposed onto the thick layer of dielectric material and into the at least one slope-walled terminal stud via, providing electrical communication between the first and the second metallization layers;
   e. a second layer of dielectric material, which is thinner than the first, thick layer of dielectric material disposed onto the second patterned metallization layer and into the slope-walled via; and
   f. means for establishing electrical communication between the second patterned metallization layer and an external device.

2. The structure recited in claim 1, wherein the silicon-based semiconductor material comprises silicon and germanium.

3. The structure recited in claim 1, wherein the silicon-based semiconductor substrate includes a ground plane layer on which is disposed the first metallization layer.

4. The structure recited in claim 1, wherein the first, thick layer of dielectric material comprises an organic dielectric material.

5. The structure recited in claim 4, wherein the first, thick organic dielectric material comprises a cured polyimide.

6. The structure recited in claim 5, wherein the cured polyimide is about 4 microns to about 40 microns thick.

7. The structure recited in claim 1, wherein the laser-ablated slope-walled via comprises a via whose wall is sloped at an angle between about 52 degrees and about 71 degrees.

8. The structure recited in claim 7, wherein the laser-ablated slope-walled via comprises a via having walls sloped at an angle of about 62 degrees.

9. The structure recited in claim 1, wherein the laser-ablated slope-walled via is about 10 microns to about 25 microns wide at its narrowest diameter.

10. The structure recited in claim 1, wherein the second patterned metallization layer comprises at least one microwave element.

11. The structure recited in claim 10, wherein the at least one microwave element comprises at least one microwave transmission line.

12. The structure recited in claim 11, wherein the at least one microwave transmission line is about 3 microns to about 40 microns wide.

13. The structure recited in claim 1, wherein the second layer of dielectric material comprises polyimide.

14. The structure recited in claim 13, wherein the polyimide is about 2.5 microns to about 4 microns thick.

15. The structure recited in claim 1, wherein the first and second metallization layers comprise an aluminum-copper alloy.

16. The structure recited in claim 15, wherein the aluminum-copper alloy comprises about 0.2% to about 5% copper.

* * * * *